(12) United States Patent
Harada et al.

(10) Patent No.: US 7,466,564 B2
(45) Date of Patent: Dec. 16, 2008

(54) RADIO FREQUENCY UNIT

(75) Inventors: Keiko Harada, Fukushima-ken (JP);
Satoshi Yotsuguri, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/869,705

(22) Filed: Oct. 9, 2007

(65) Prior Publication Data

US 2008/0106883 A1  May 8, 2008

(51) Int. Cl.
*H05K 9/00* (2006.01)
(52) U.S. Cl. ............... 361/814; 361/753; 361/799; 361/800; 361/816; 361/818; 174/350; 334/85; 336/84 R
(58) Field of Classification Search .......... 361/753, 361/799, 800, 814, 816, 818; 174/50, 50.52; 334/85; 336/84 R; 455/90.3; 330/65, 68
See application file for complete search history.

(56) References Cited

U.S. PATENT DOCUMENTS

| | | | | |
|---|---|---|---|---|
| 4,404,617 A | * | 9/1983 | Ohyama et al. | 361/818 |
| 4,628,412 A | * | 12/1986 | Nigorikawa | 361/816 |
| 4,697,044 A | * | 9/1987 | Ishikawa | 174/372 |
| 5,475,876 A | * | 12/1995 | Terada et al. | 455/301 |
| 5,710,999 A | * | 1/1998 | Iwase et al. | 455/349 |
| 6,011,700 A | * | 1/2000 | Matsuzaki | 361/816 |
| 6,112,259 A | * | 8/2000 | Marsanne et al. | 710/22 |
| 6,363,260 B1 | | 3/2002 | Achour et al. | |
| 6,731,518 B2 | * | 5/2004 | Suzuki et al. | 361/818 |
| 6,775,151 B2 | * | 8/2004 | Suzuki | 361/788 |
| 7,042,529 B2 | * | 5/2006 | Wakamori et al. | 348/836 |
| 7,113,061 B2 | * | 9/2006 | Ootori et al. | 334/85 |

FOREIGN PATENT DOCUMENTS

JP  2003-123913  4/2003

* cited by examiner

*Primary Examiner*—Jeremy C Norris
*Assistant Examiner*—Dameon E Levi
(74) *Attorney, Agent, or Firm*—Bever Law Group LLP

(57) ABSTRACT

The invention provides a radio frequency unit including a box-shaped chassis into which an insulating board loaded with electronic components is housed, and two connectors attached to a front plate of the chassis with a space therebetween. A supporting member protruding into the chassis is provided in a position between the two connectors in the front plate. The supporting member has a flat plate portion that is bent at right angles from an end face of the front plate, and extends parallel to the insulating board, and a pair of tongue pieces that are formed so as to be bent towards the inside of the chassis from both side ends of the flat plate portion. The pair of tongue pieces are located in a cutout portion provided in the insulating board, and the tongue pieces are soldered to a grounding pattern provided in the insulating board.

4 Claims, 4 Drawing Sheets

RADIO FREQUENCY UNIT

BACKGROUND OF THE INVENTION

1. Field of the Invention

The present invention relates to a radio frequency unit suitable to be applied to an RF switch, etc. that is used for a television receiver.

2. Description of the Related Art

FIG. 8 is a perspective view of a conventional radio frequency unit, and FIG. 9 is a sectional view taken along C-C of the invention. Next, the configuration of the conventional radio frequency unit will now be described with reference to FIGS. 8 and 9. A box-shaped chassis 51 made of a metal plate includes a front plate 51a, top and bottom plates 51b and 51c bent rearward from the top and bottom positions of the front plate 51a, a rear plate 51d provided between the top and bottom plates 51b and 51c, a side plate 51e that blocks up one side face of the chassis 51, an open portion 51f provided at the other side face of the chassis 51, a plurality of downwardly extending attachment legs 51g, and an attachment portion 51j provided at the front plate 51a and having a hole 51h.

Each of first, second, and third coaxial connectors 53, 53, and 54 has an external conductor 55, and a central conductor 57 attached to the inside of the external conductor 55 via an insulator 56. Among them, the first and second connectors 52 and 53 are attached to the front plate 51a with an attachment portion 51j therebetween, and the third connector 54 is attached to the side plate 51e.

Although not shown, an insulating board 58 is provided with a wiring pattern, and electronic components loaded on the insulating board 58. As shown in FIG. 9, the insulating board 58 is housed into the chassis 51 through the open portion 51f with a clearance K between itself and the chassis 51.

The insulating board 58 is attached between the front plate 51a or rear plate 51d of the chassis 51 and grounding wiring pattern with solder 59, and the central conductor 57 is connected to a wiring pattern for signals with solder.

Further, when a cover 60 is attached to the chassis 51 so as to cover the open portion 51f, and the chassis 51 is shielded, a conventional radio frequency unit is formed.

In the conventional radio frequency unit having such a configuration, as shown in FIG. 8, the first and second connectors 52 and 53 are respectively inserted through two insertion holes 61a provided in a chassis 61 of an electric appliance, a screw 62 is screwed into a hole 51h through a hole 61b of the chassis 61 in a state the attachment portion 51j is matched with the rear face of the chassis 61, and the attachment legs 51g are attached to a sub-board of an electrical appliance (not shown). Further, the third connector is connected to a fourth coaxial connector 64 attached to the chassis 61 via a coaxial cable 64 and a fifth connector 65. (For example, refer to JP-A-2003-123913).

However, in the conventional radio frequency unit, the insulating board 58 is attached between the front plate 51a or rear plate 51d of the chassis 51 and the grounding wiring pattern with the solder 59. Therefore, if a temperature change occurs under a use environment, the chassis 51 made of a metallic material and the insulating board 58 made of an insulating material have different coefficient of thermal expansion. Therefore, due to a difference in expansion or contraction between the chassis 51 and the insulating board 58, there is a problem in that the solder 69 between the chassis 51 and the wiring pattern is peeled off, and grounding of the wiring pattern becomes insufficient.

SUMMARY OF THE INVENTION

The present invention has been made in view of such actual circumstances in such related art, and it is therefore an object of the invention to provide a radio frequency unit with no peeling-off of solder between a chassis and a wiring pattern.

In order to achieve the above object, a radio frequency unit of the invention includes a box-shaped chassis into which an insulating board loaded with electronic components is housed, and two connectors attached to a front plate of the chassis with a space therebetween. Here, a supporting member protruding into the chassis is provided in a position between the two connectors in the front plate. The supporting member has a flat plate portion that is bent at right angles from an end face of the front plate, and extends parallel to the insulating board, and a pair of tongue pieces that are formed so as to be bent towards the inside of the chassis from both side ends of the flat plate portion. The pair of tongue pieces are located in a cutout portion provided in the insulating board, and the tongue pieces are soldered to a grounding pattern provided in the insulating board.

In the invention configured in this way, the insulating board is soldered to the tongue pieces of the supporting member bent from the front plate of the chassis. Therefore, even if a difference is caused in expansion or contraction between the chassis of a metallic material and the insulating board made of an insulating material under a use environment, the tongue pieces having a free end are moved to follow the expansion or contraction of the insulating board. As a result, sufficient grounding can be obtained without peeling-off of the solder between the tongue pieces and the insulating board. Also, the supporting member is located between inside the chassis between the two connectors. Therefore, when the two connectors are used for input, the grounding between the connectors inside the chassis becomes positive. As a result, excellent isolation is obtained between the connectors.

Further, in the radio frequency unit of the invention, preferably, the tongue pieces are brought into resilient contact with inner faces of the cutout portion of the insulating board.

In the invention configured in this way, the tongue pieces are brought into resilient contact with the insulating board, so that the space between the tongue pieces and the insulating board can be removed, and the soldering between the tongue pieces and the insulating board can become good.

Further, in the radio frequency unit of the invention, preferably, a shield plate that divides the inside of the chassis is provided in a position between the two connectors inside the chassis, and the shield plate is soldered to the grounding pattern.

In the invention configured in this way, the provision of the shield plate that divides the inside of the chassis makes it possible to obtain excellent isolation between the connectors or between divided partition chambers.

Further, in the radio frequency unit of the invention, preferably, an attachment portion having a hole is provided in a position between the two connectors in the front plate, and the attachment portion and the supporting member are arranged on a straight line orthogonal to a straight line connecting the two connectors.

In the invention configured in this way, the attachment portion and the supporting member are arranged on a straight line orthogonal to a straight line connecting the two connectors. Therefore, the attachment portion and the supporting member can be formed in a narrow lateral direction of the front plate, thereby allowing miniaturization.

According to the radio frequency unit of the invention, the insulating board is soldered to the tongue pieces of the supporting member bent from the front plate of the chassis. Therefore, even if a difference is caused in expansion or contraction between the chassis of a metallic material and the insulating board made of an insulating material under a use environment, the tongue pieces having a free end are moved to follow the expansion or contraction of the insulating board. As a result, sufficient grounding can be obtained without peeling-off of the solder between the tongue pieces and the insulating board.

DESCRIPTION OF THE PREFERRED EMBODIMENT

Figure 1:
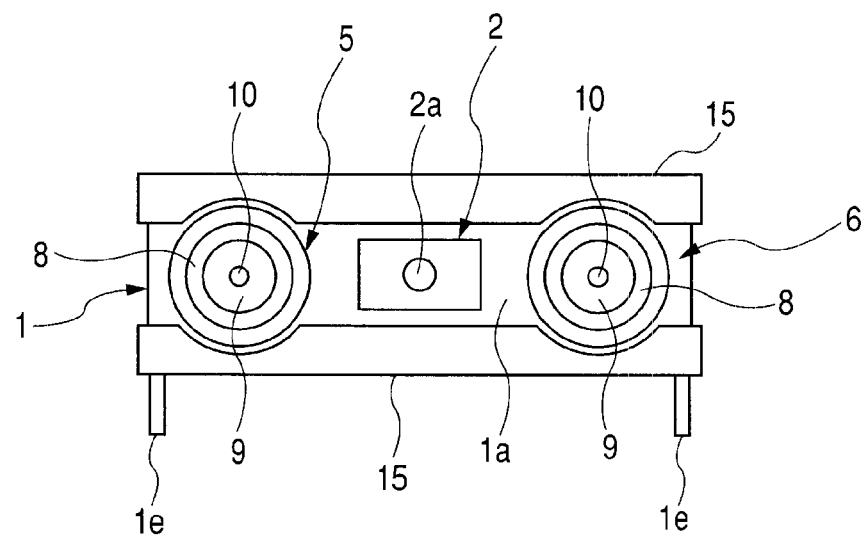
FIG. 1 is a plan view of a radio frequency unit of the invention.
Figure 2:
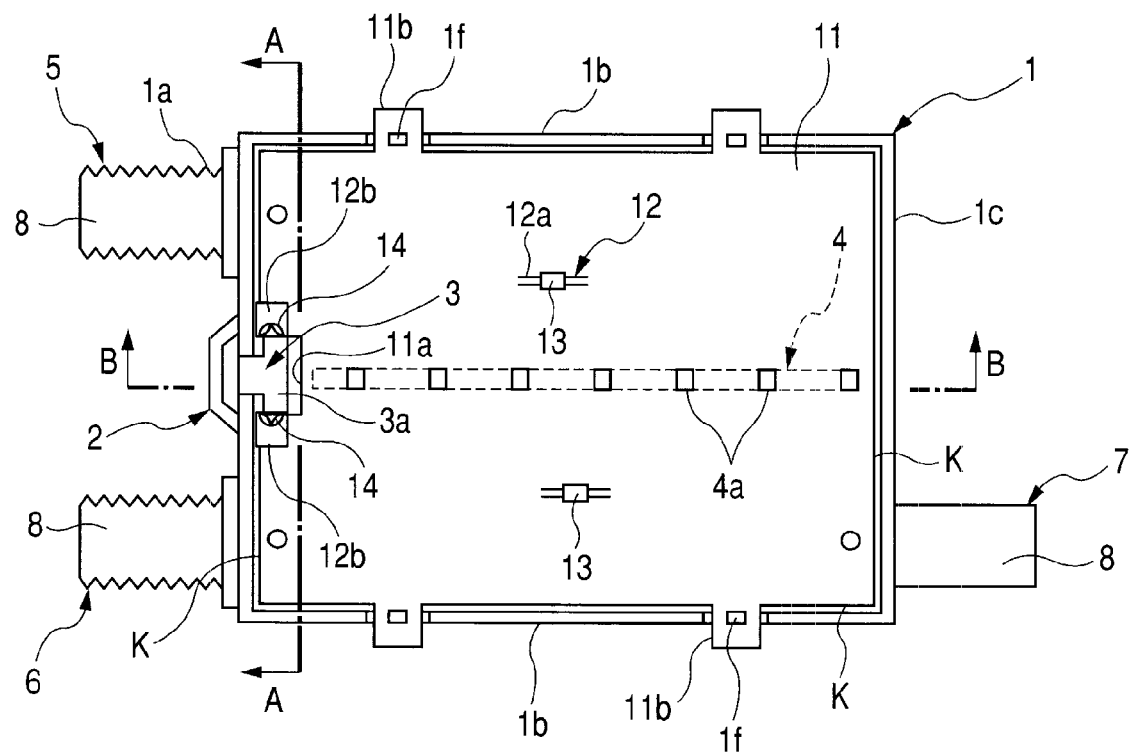
FIG. 2 is a plan view the radio frequency unit of the invention in a state where a cover is removed.
Figure 3:
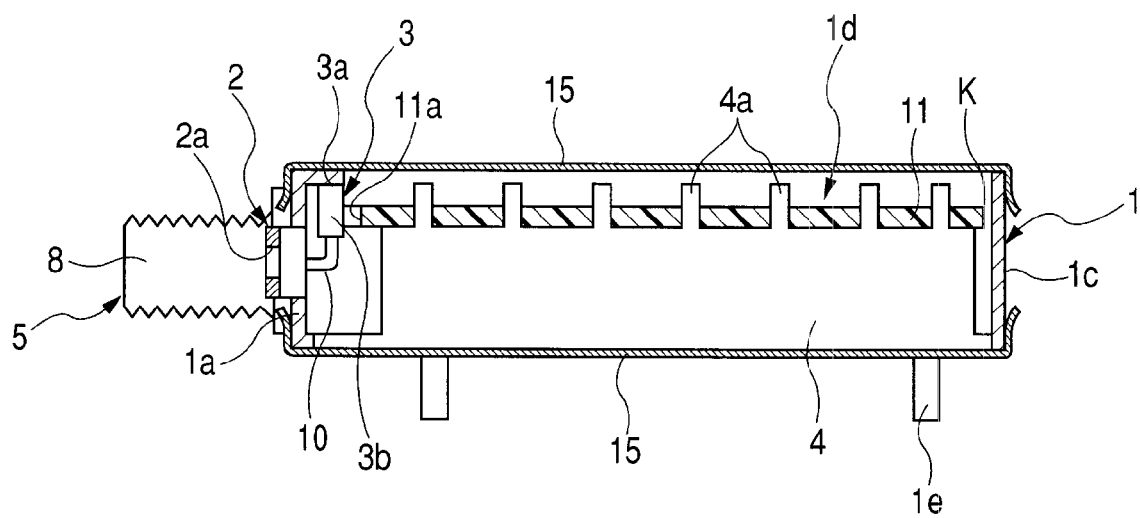
FIG. 3 is a sectional view taken along line A-A.
Figure 4:
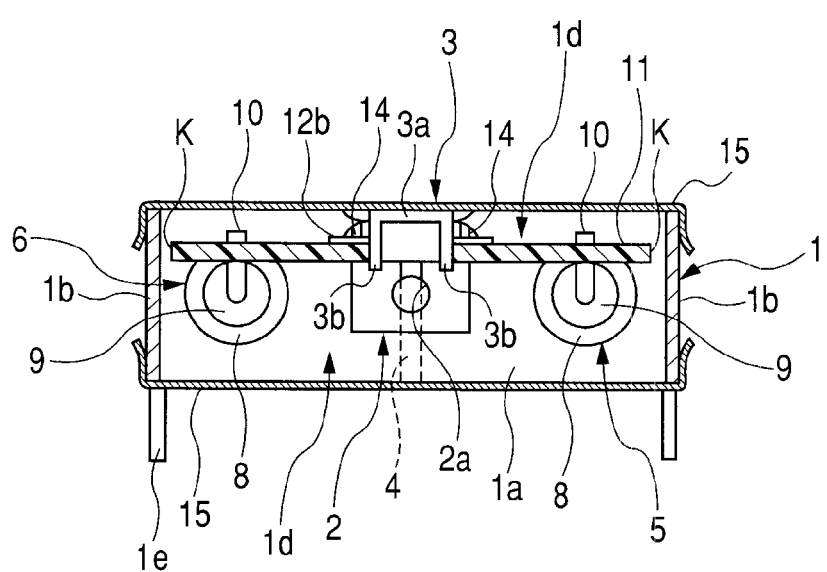
FIG. 4 is a sectional view taken along line B-B.
Figure 5:
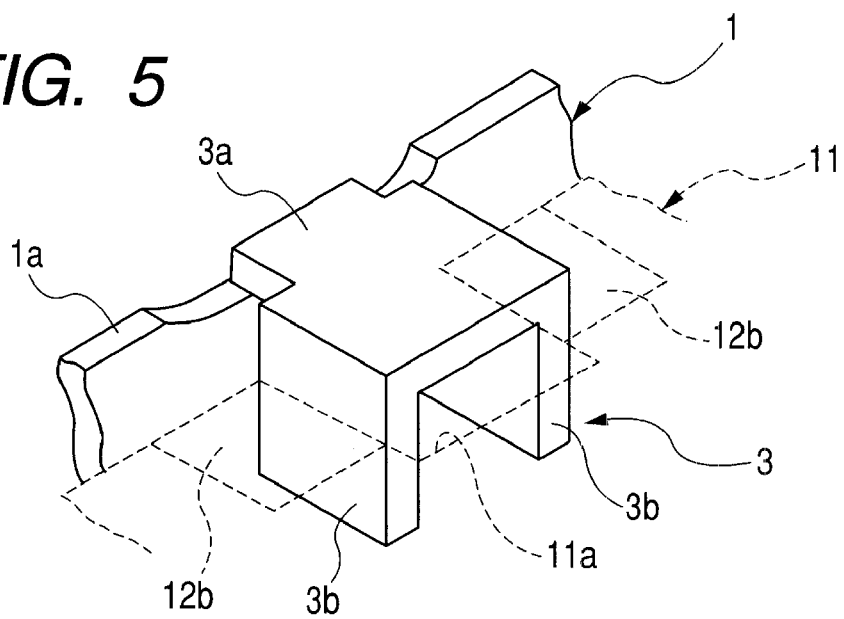
FIG. 5 is an enlarged perspective view showing portions of a supporting member relating to the radio frequency unit of the invention.
Figure 6:
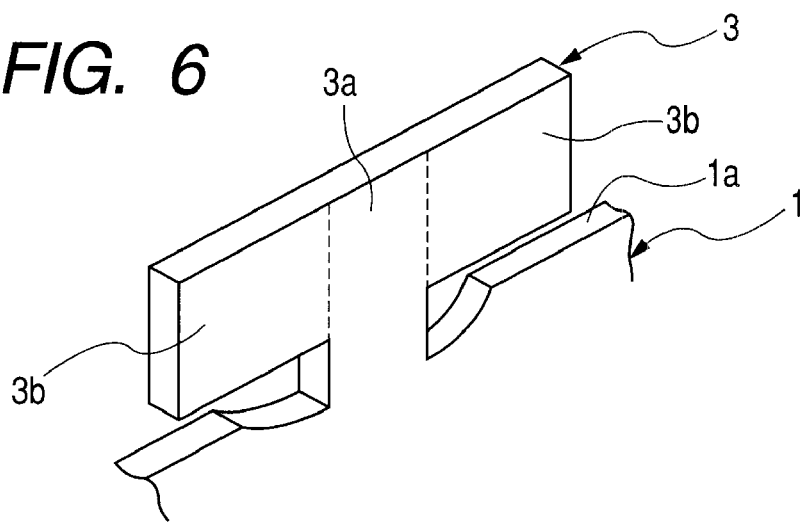
FIG. 6 is a deployed view showing a method of forming the supporting member relating to the radio frequency unit of the invention.
Figure 7:
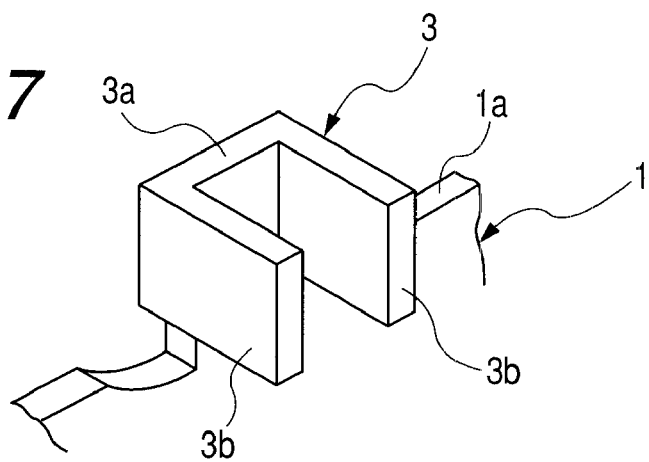
FIG. 7 is an exploded view showing the method of forming the supporting member relating to the radio frequency unit of the invention.

A preferred embodiment of the invention will now be described with reference to the drawings. FIG. 1 is a plan view of a radio frequency unit of the invention, FIG. 2 is a plan view the radio frequency unit of the invention in a state where a cover is removed, FIG. 3 is a sectional view taken along line A-A, FIG. 4 is a sectional view taken along line B-B, FIG. 5 is an enlarged perspective view showing portions of a supporting member relating to the radio frequency unit of the invention, FIG. 6 is a deployed view showing a method of forming the supporting member relating to the radio frequency unit of the invention, and FIG. 7 is an exploded view showing the method of forming the supporting member relating to the radio frequency unit of the invention.

Next, the configuration of the radio frequency unit of the invention will now be described with reference to FIGS. 1 to 7. A box-shaped chassis 1 made of a metal plate includes an oblong front plate 1a, a pair of side plates side plates 1b bent from both side ends of the front plate 1a, a rear plate 1c that covers a rear portion between the pair of side plates side plates 1b, open portions 1d provided at the top and bottom sides, and a plurality of attachment legs 1e.

Further, the front plate 1a of the chassis 1 is provided with a trapezoidal attachment portion 2 formed so as to protrude forward by projecting processing, and the central portion of the supporting member 3 is provided with a hole 2a.

Moreover, the chassis 1 has a supporting member 3, connected to an upped end face (end face) of the front plate 1a. Particularly as shown in FIG. 5, the supporting member 3 has a flat plate portion 3a that is bent towards the open portions 1d at right angles from the end face of the front plate 1a, and extends parallel to an insulating board 11 to be described later, and a pair of opposed tongue pieces 3b formed so as to be bent inward of the chassis 1 from both side ends of the flat plate portion 3a.

A method of forming the supporting member 3 will now be described with reference to FIGS. 6 and 7. First, as shown in FIG. 6, a member that is connected to an upper end face of the front plate 1a and is formed in the shape of the letter "T" by the flat plate portion 3a and the tongue pieces 3b is prepared. Next, as shown in FIG. 7, after a pair of mutually facing tongue pieces 3b are formed by bending the member at positions indicated by dot lines of FIG. 6, the flat plate portion 3a is bend at right angles from the end face of the front plate 1a. Then, the supporting member 3 as shown in FIG. 5 is formed.

Further, such a supporting member 3 and the attachment portion 2 are arranged on a straight line orthogonal to a straight line connecting two connectors 5 and 6 to be described later. This makes it possible to form the attachment portion and the supporting member in a narrow lateral direction of the front plate 1a, thereby allowing miniaturization.

Moreover, the chassis 1 is provided with a shield plate 4 that is connected to the front plate 1a and the rear plate 1c to divide the inside of the chassis 1 into two partition chambers. This shield plate 4 is arranged in a position extending rearward from the supporting member 3.

Each of the first, second, third coaxial connectors 5, 6, and 7 has an external conductor 8, and a central conductor 10 attached to the inside of the external conductor 8 via the third insulating layer 9. Among them, the first and second connector 5 and 6 are attached to the front plate 1a with the attachment portion 2 therebetween, and the third connector 7 is attached to the rear plate 1c.

In the present embodiment, the threaded first connector 5 is adapted to be used for first input, the threaded second connector 6 is adapted to be for used second input, and the non-threaded third connector 7 is adapted to be used for output.

Also, the supporting member 3 and the shield plate 4 are arranged between the central conductors 10 of the first and second connectors 5 and 6, thereby improving isolation between the first and second connectors 5 and 6.

The insulating board 11 is formed in an oblong shape, and has a cutout portion 11a provided at a front face at a short side and a plurality of protruding portions 11b protruding from both side faces at long sides. This insulating board 11 is provided with a wiring pattern 12 having a signal pattern 12a and a grounding pattern 12b, and electronic components 13 loaded on the insulating board 11. Among the electronic component 13, chip-type parts having a low height are arranged at one face (top face) of the insulating board 11, and parts having high height, such as coils, are arranged on the other face (bottom face) of the insulating board 11.

Then, the insulating board 11 is housed into the chassis 1 from the top open portion 1d with a clearance K between itself and the chassis 1 (front, side, and rear plates 1a, 1b, and 1c).

At this time, after the flat plate portion 3a of the supporting member 3 is first inserted into the cutout portion 11a of the insulating board 11, the tongue pieces 3b are brought into resilient contact with the inner faces of the cutout portion 11a. Further, protruding pieces if provided on the chassis 1 are adapted to pass through the protruding portions 11b of the insulating board 11, respectively.

Then, the tongue pieces 3b are connected and attached to the grounding pattern 12b provided in the vicinity of the cutout portion 11a with solder 14. Although not shown herein, protruding pieces if and 4a are connected and attached to the grounding pattern 12b with the solder 14. Further, the central conductors 10 of the first, second, and third connectors 5, 6, and 7 are adapted to be soldered to the signal pattern 12a, though not shown.

Further, when the insulating board 11 is attached to the inside of the chassis 1, the flat plate portion 3a of the supporting member 3 becomes parallel to the insulating board 11, and the tongue pieces 3b become substantially vertical to the insulating board 11.

In addition, when the supporting member 3 is formed in a trapezoidal shape with the flat plate portion 3a as a top face, it is possible to facilitate insertion of the flat plate portion 3a into the cutout portion 11a, and resilient contact of the tongue pieces 3b with the inner faces of the cutout portions 11a.

Further, the cover 15 made of a metal plate is attached to the chassis 1 in a state where it covers the top and bottom open portions 1d, and the chassis 1 is shielded, thereby forming the radio frequency unit of the invention.

Figure 8:
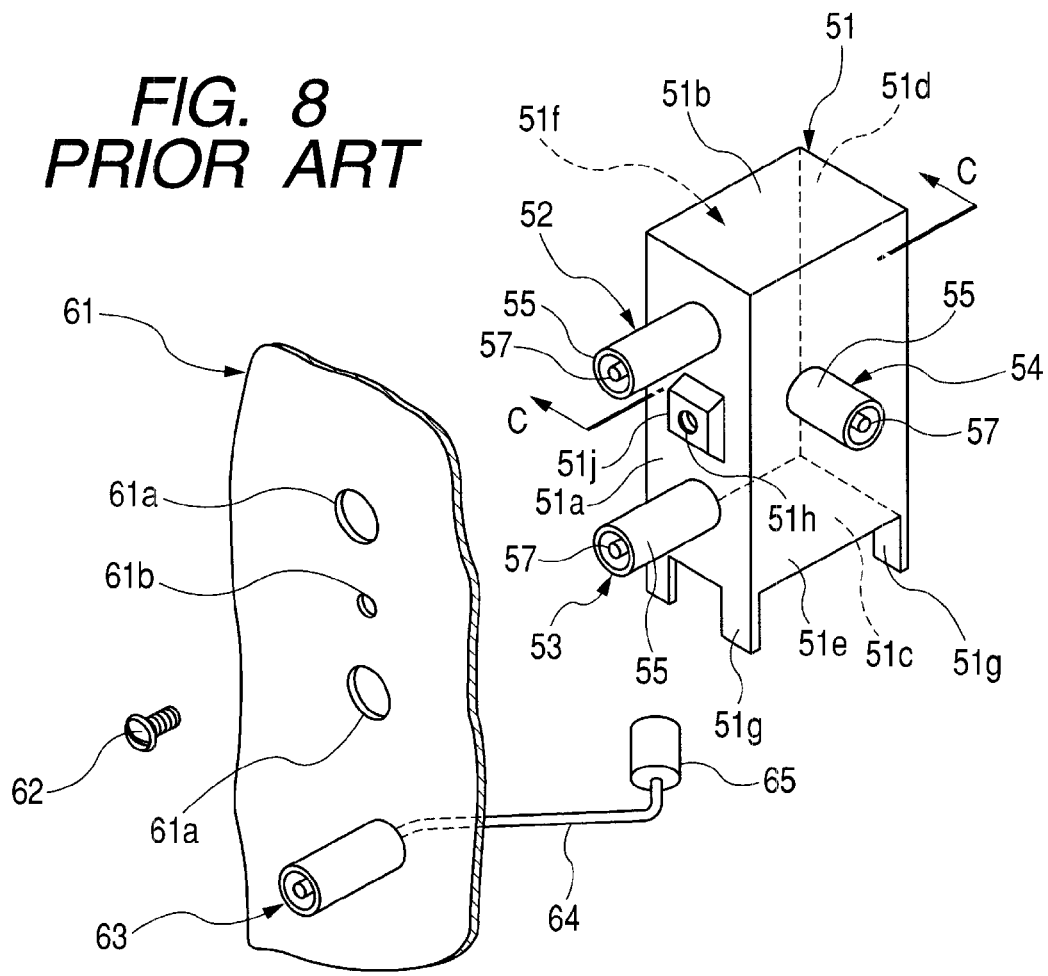
FIG. 8 is a perspective view of a conventional radio frequency unit.
Figure 9:
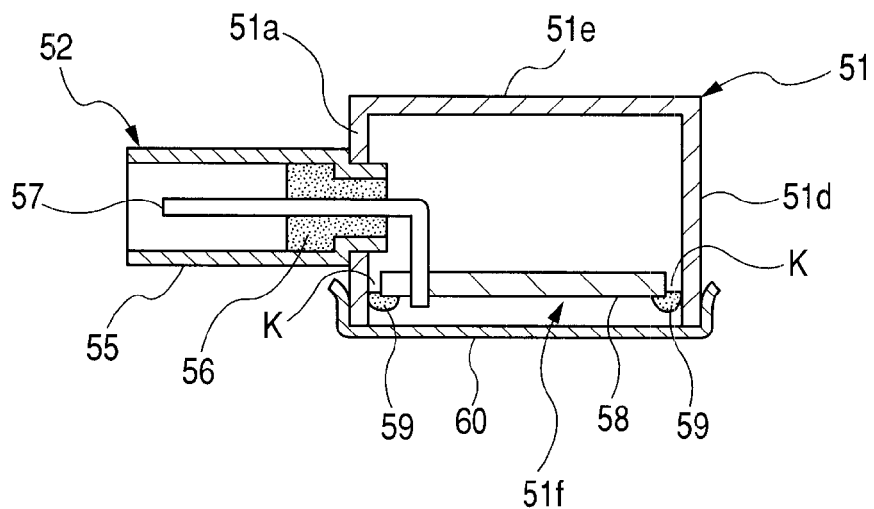
FIG. 9 is a sectional view taken along C-C of the invention.

In the radio frequency unit of the invention having such a configuration, similarly to the related art shown in FIG. 8 though not shown herein, the first and second connectors 5 and 6 are respectively inserted through two insertion holes provided in a chassis of an electric appliance, a screw is screwed into the hole 2a through a hole of a chassis in a state the attachment portion 2 is matched with the rear face of the chassis, and the attachment legs 1e are attached to a sub-board of an electrical appliance. The invention claimed is:

The invention claimed is:

1. A radio frequency unit comprising:
   a box-shaped chassis;
   an insulating board housed in the chassis, the insulating board having electronic components and grounding pattern thereon, the insulating board having a cutout portion provided thereon;
   two connectors attached to a front plate of the chassis with a space therebetween; and
   a supporting member protruding into the chassis provided in a position between the two connectors in the front plate,
   wherein the supporting member includes:
      a flat plate portion that is bent at right angles from an end face of the front plate, and extends inwardly and parallel to the insulating board, and
      a pair of tongue pieces that are bent towards the inside of the chassis from both side ends of the flat plate portion, and
   wherein the pair of tongue pieces are located in the cutout portion of the insulating board, and the tongue pieces are soldered to the grounding pattern of the insulating board.

2. The radio frequency unit according to claim 1,
   wherein the tongue pieces are brought into resilient contact with inner faces of the cutout portion of the insulating board.

3. The radio frequency unit according to claim 1, further comprising:
   a shield plate provided inside of the chassis, the shield plate extending from the front plate to a rear plate of the chassis so as to divide the inside of the chassis between the two connectors, the shield plate being soldered to the grounding pattern.

4. The radio frequency unit according to claim 1, further comprising:
   an attachment portion having a hole provided on the front plate in a position between the two connectors, the attachment portion and the supporting member being arranged on a straight line orthogonal to a straight line connecting the two connectors.

\* \* \* \* \*